(12) United States Patent
Hurwitz et al.

(10) Patent No.: US 9,001,534 B2
(45) Date of Patent: Apr. 7, 2015

(54) TRANSFORMER DRIVER CIRCUIT WITH IC PROTECTION CIRCUITRY

(75) Inventors: Jonathan Ephraim David Hurwitz, Edinburgh (GB); Seyed Danesh, Edinburgh (GB); Steven Maughan, Edinburgh (GB)

(73) Assignee: Broadcom Europe Limited, London (GB)

( * ) Notice: Subject to any disclaimer, the term of this patent is extended or adjusted under 35 U.S.C. 154(b) by 237 days.

(21) Appl. No.: 13/515,464

(22) PCT Filed: Dec. 17, 2010

(86) PCT No.: PCT/GB2010/052132
§ 371 (c)(1),
(2), (4) Date: Jun. 26, 2012

(87) PCT Pub. No.: WO2011/077121
PCT Pub. Date: Jun. 30, 2011

(65) Prior Publication Data
US 2012/0306472 A1 Dec. 6, 2012

(30) Foreign Application Priority Data
Dec. 22, 2009 (GB) .................................. 0922381.9

(51) Int. Cl.
| H02M 3/335 | (2006.01) |
| H02M 7/538 | (2007.01) |
| H03K 17/691 | (2006.01) |
| H03F 3/217 | (2006.01) |
| G01R 19/00 | (2006.01) |

(52) U.S. Cl.
CPC .............. *H03K 17/691* (2013.01); *H03F 3/217* (2013.01); *G01R 19/0092* (2013.01); *H03F 2200/273* (2013.01); *H03F 2200/541* (2013.01)

(58) Field of Classification Search
USPC ............ 363/24, 56.04, 153, 171, 25, 97, 134; 323/328, 337, 355
See application file for complete search history.

(56) References Cited

U.S. PATENT DOCUMENTS

| 4,030,015 | A | * | 6/1977 | Herko et al. ..................... 363/16 |
| 4,052,659 | A | * | 10/1977 | Fletcher et al. .................. 363/57 |
| 4,155,113 | A | * | 5/1979 | Simmons ......................... 363/24 |
| 4,156,210 | A | | 5/1979 | Lipke |
| 4,293,902 | A | * | 10/1981 | White .............................. 363/26 |
| 4,605,997 | A | * | 8/1986 | Kirk ................................ 363/16 |

(Continued)

OTHER PUBLICATIONS

International Search Report, International Application No. PCT/GB2010/052132, Apr. 26, 2011, 3 pages.

*Primary Examiner* — Timothy J Dole
*Assistant Examiner* — Yusef Ahmed
(74) *Attorney, Agent, or Firm* — Garlick & Markison; Bruce E. Garlick (57) ABSTRACT

A transformer driver circuit couples to a transformer having a primary winding, a secondary winding, and a transformer tap that is connected to a first voltage source. The primary winding electrically connects at its ends to respective unipolar controllable current sinks that form part of an integrated circuit. The transformer driver circuit operates by each current sink selectively sinking current from the end of the primary winding to which it is connected so as to cause current to flow in the secondary winding in a push-pull fashion. The transformer driver circuit further includes a load electrically connected to the secondary winding and protection circuitry operative to protect the integrated circuit from input levels greater than it can withstand.

20 Claims, 9 Drawing Sheets

(56) References Cited

U.S. PATENT DOCUMENTS

| | | | |
|---|---|---|---|
| 4,797,803 A * | 1/1989 | Carroll | 363/95 |
| 4,881,023 A * | 11/1989 | Perusse et al. | 323/266 |
| 5,907,481 A * | 5/1999 | Svardsjo | 363/25 |
| 5,929,776 A * | 7/1999 | Warble et al. | 340/7.32 |
| 6,040,662 A * | 3/2000 | Asayama | 315/291 |
| 7,046,526 B2 * | 5/2006 | Toda et al. | 363/24 |
| 7,218,541 B2 * | 5/2007 | Price et al. | 363/134 |
| 7,423,891 B2 * | 9/2008 | Ho et al. | 363/26 |
| 7,633,769 B2 * | 12/2009 | Toda et al. | 363/26 |
| 7,719,861 B2 * | 5/2010 | Ochi et al. | 363/24 |
| 7,835,164 B2 * | 11/2010 | Lyle, Jr. | 363/24 |
| 2002/0154517 A1 * | 10/2002 | Chutjian et al. | 363/13 |
| 2006/0120117 A1 * | 6/2006 | Toda et al. | 363/24 |
| 2007/0075700 A1 * | 4/2007 | Nakahori | 323/355 |
| 2007/0194831 A1 * | 8/2007 | Ochi et al. | 327/379 |
| 2008/0055945 A1 * | 3/2008 | Chan et al. | 363/24 |
| 2008/0309305 A1 * | 12/2008 | Atmur | 323/301 |
| 2009/0154204 A1 * | 6/2009 | Taylor | 363/52 |

* cited by examiner

Fig. 1a

PRIOR ART

Fig. 1b

PRIOR ART

Fig. 1c

PRIOR ART

TRANSFORMER DRIVER CIRCUIT WITH IC PROTECTION CIRCUITRY

FIELD OF THE INVENTION

The present invention relates to a transformer driver circuit and in particular but not exclusively networking apparatus comprising such a transformer driver circuit.

BACKGROUND TO THE INVENTION

Figure 1A:
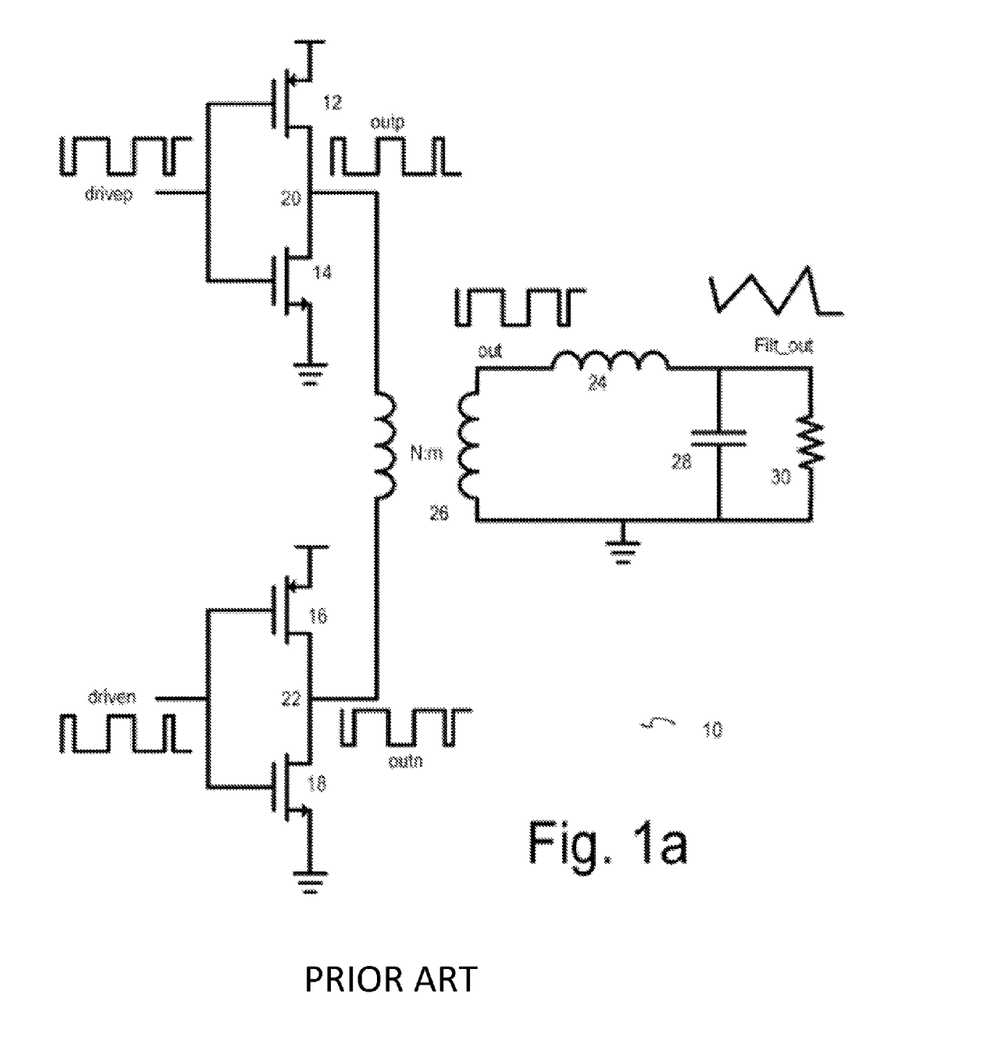
FIG. 1A is a circuit diagram of a known Class-D amplifier.
Figure 1B:
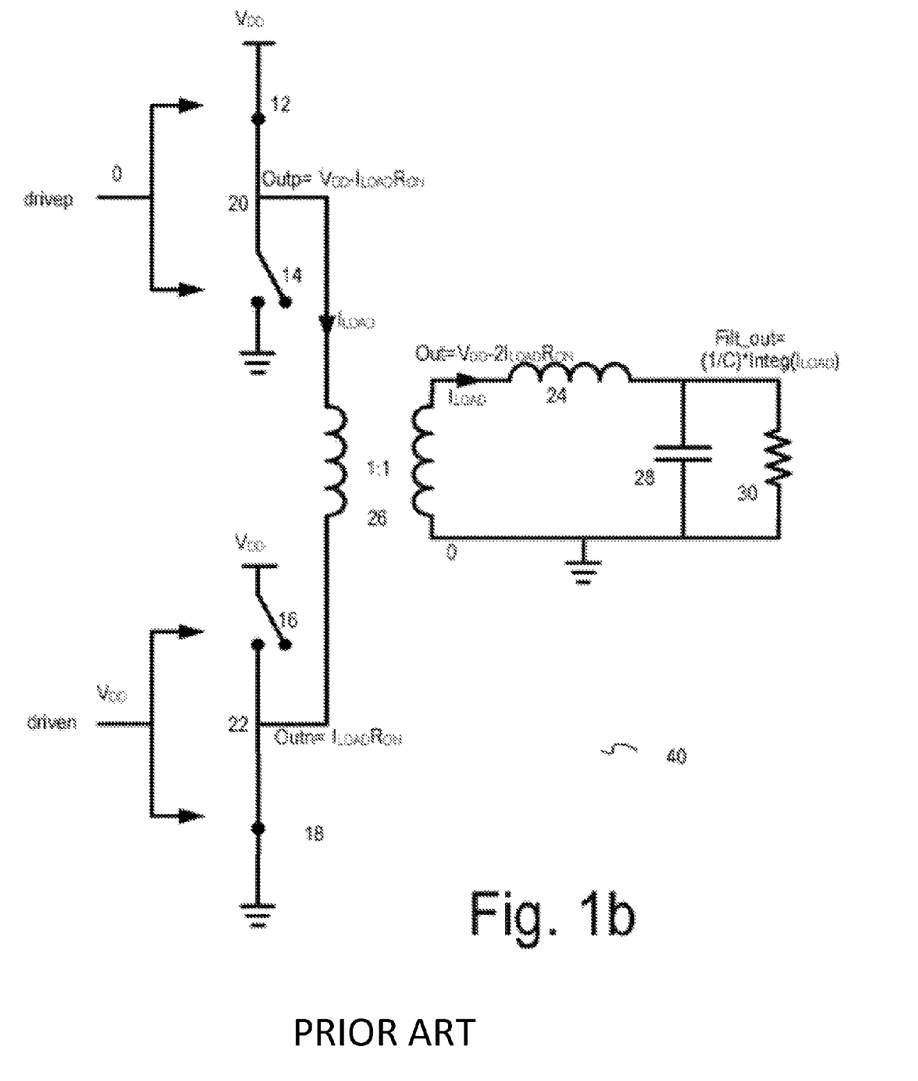
FIG. 1B represents the circuit of FIG. 1A when energy flows from the supply to the inductor.
Figure 1C:
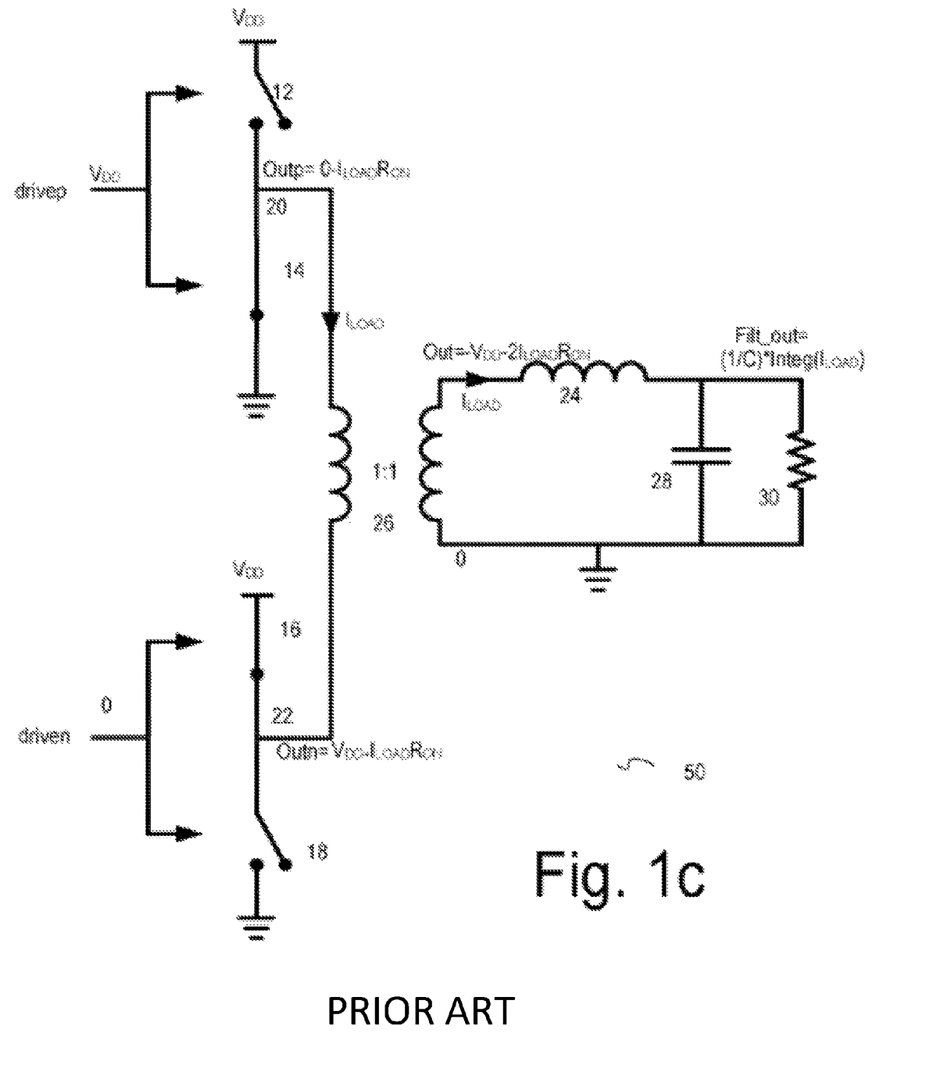
FIG. 1C represents the circuit of FIG. 1A when energy flows from the inductor to the supply.

A known transformer driver, in this case a Class-D amplifier, 10 is shown in FIG. 1A. The Class-D amplifier makes use of a P/N totem pole H-bridge configuration 12, 14, 16, 18 to drive two load terminals 20, 22 to alternate supply voltages in an active fashion. In FIG. 1A the alternate supply voltages are ground and VDD. The voltage between the load terminals 20, 22 is applied to an inductor 24 of an LC filter by way of a transformer 26 to induce current flow in the inductor in accordance with I=(1/L)*integral(Vout−Vfilt_out), where L is the inductance of the inductor, Vout is the voltage across the secondary winding of the transformer and Vfilt_out is the voltage across the capacitor 28 of the LC filter. A resistive load 30 is present at the output of the LC filter. The induced current flow is drawn through the transformer from whichever supply, i.e. ground or VDD, is presently driving the output. Thus energy is transferred from the supply to the inductor 24 as is shown in FIG. 1B or from the inductor back to the supply as is shown in FIG. 1C depending on the direction of the load current. The components in FIGS. 1B and 1C have the same reference numerals as the corresponding components in FIG. 1A. Assuming the transistors 12, 14, 16, 18 to be performing as ideal switches and an ideal inductor, capacitor and resistor, the only energy loss is that which results from the ripple voltage present across the load resistor 30.

Where an increase in injected power is required, the load resistance 30 is reduced. However, at some point during the course of reducing the load resistance the parasitic resistances in the circuit become significant compared to the load resistance and efficiency decreases rapidly. The parasitic resistances are present as transistor on-state resistance and parasitic series resistance in the LC filter and the transformer. If the load resistance is further reduced it becomes impossible to achieve the required injected power because the parasitic resistances are too large.

It is an object of the invention to address one or more of the above issues and provide a transformer driver of acceptable efficiency and able to provide for increased injection of power between a primary winding and a secondary winding of the transformer to handle increased output power.

STATEMENT OF INVENTION

According to a first aspect of the present invention there is provided transformer driver circuit comprising:
  a transformer comprising a primary winding and a secondary winding, the primary winding being electrically connected at a first end to a first unipolar controllable current sink and at a second end to a second unipolar controllable current sink, said first and second current sinks comprising part of an integrated circuit;
  the primary winding comprising a transformer tap electrically connected to a first voltage source, the circuit being operable such that said first current sink selectively sinks current from said first end of the primary winding and said second current sink selectively sinks current from said second end of the primary winding so as to cause current to flow in the secondary winding in a push-pull fashion;
  a load electrically connected to the secondary winding; and
  protection circuitry operative to protect said integrated circuit from input levels greater than it can handle, their magnitude resultant from the magnitude of said first voltage source.

In use, each of the first and second current sources is controlled so as to drive the secondary winding in a push pull fashion. Thus, for example, during a first half of a cycle the first current sink may be operated, whereby the first end of the primary winding is connected to a second voltage level such that current is drawn through the primary winding between the first end and the tap in a first direction. During a second half of the cycle the second current sink may be operated, whereby the second end of the primary winding is connected to a second voltage level such that current is drawn through the primary winding between the second end and the tap in a second direction opposite the first direction. Therefore, current flow during operation of the transformer driver circuit is unipolar through the primary winding.

More specifically, the transformer tap may be a centre tap.

Alternatively or in addition, the transformer tap may be electrically connected to a high voltage. Thus, the transformer may be in a high sided configuration with respect to the first and second current sinks. In the high sided configuration the first and second current sinks may be operable to drive current through the primary winding in a pull-pull fashion.

Alternatively or in addition, the primary winding may comprise two series connected primary windings with the transformer tap being defined by a connection between the two primary windings. The secondary winding and the two primary windings may be disposed so as to provide for inductive coupling between each of the two primary windings and the secondary winding. Each of the two primary windings and the secondary winding may be constituted by a discrete component.

Alternatively or in addition, at least one of the first and second current sinks may be an active circuit.

The first voltage may be comprised from a source other than a voltage supply of the integrated circuit. Having at least one of the high voltage and the low voltage at a value greater than a limit imposed on the integrated circuit supply voltage may have the benefit of increasing the injected power. This may be of particular benefit where the first and second current sinks are formed as part of a low voltage integrated circuit, such as a low voltage CMOS circuit.

The first and second current sinks, in the first aspect, are unable to tolerate a high supply voltage. Hence, the transformer driver circuit comprises said protection circuitry which may comprise at least one of a first protection circuit and a second protection circuit, the first protection circuit being in series between the first end of the primary winding and the first current sink, and the second protection circuit being in series between the second end of the primary winding and the second current sink. The protection circuit may be operative to limit a voltage across the current sink.

More specifically and where the first and second current sinks form part of an integrated circuit, a protection circuit may be apart from the integrated circuit, e.g. the protection circuit may be formed from discrete components. Thus, the protection circuit may comprise at least one active device that is capable of tolerating a high voltage.

Alternatively or in addition, a protection circuit may comprise a transistor, such as a MOS transistor, with an input, such a gate of the MOS transistor, maintained substantially at a bias voltage.

Alternatively or in addition, at least one of the first and second current sinks may comprise a transistor, e.g. a MOS transistor, in series between an end of the primary winding.

Alternatively or in addition and where the first and second current sinks form part of an integrated circuit, a protection circuit may also form part of the integrated circuit.

More specifically, the protection circuit may be configured to have adaptive biasing that is operative to vary a voltage across a current sink. Thus, the adaptively biased protection circuit may be operative to keep the voltage across each of the current sink and the protection circuit within tolerable limits.

More specifically, the protection circuit may comprise a transistor and a biasing controller, the biasing controller receiving an input signal from each of opposing outputs of the transistor (e.g. source and drain where the transistor is a MOS transistor) and generating a biasing output that is received at an input (e.g. gate) of the transistor. The biasing controller may be operative to change the biasing output in dependence on the transistor outputs and having regards to voltage limits for the transistor and the current sink.

The transformer driver circuit may further comprise: an control circuit that is operative to provide control signals to the first and second current sinks in dependence on at least one input signal; and a feedback circuit operative to provide at least one feedback signal from the transformer to the control circuit. Thus, the control circuit may be operative in dependence on the at least one input signal and the at least one feedback signal. In use, the control circuit may be operative to change the control signals so as to avoid saturation in the transformer driver circuit. The feedback circuit may provide for calibration of the transformer driver circuit, e.g. such that the transformer driver circuit has substantially matching transfer functions when each of the first and second current sinks operates in turn. Also, the feedback circuit may be of particular benefit where the load is unknown or the load varies, e.g. in applications such as in multi-media networking in residential or commercial premises, and thus there is a possibility of saturation in the transformer driver circuit.

More specifically, a first feedback signal to the modulator may be from the first end of the primary winding and a second feedback signal to the modulator may be from the second end of the primary winding.

Alternatively or in addition, the feedback circuit may be operative to attenuate the at least one signal fed back from the transformer. Hence, the feedback circuit may comprise a resistor network that is operative to attenuate the at least one feedback signal.

In a first embodiment, the transformer driver circuit may comprise a feedback circuit and the input circuit may comprise a modulator that is operative to provide first and second switching control signals to the first and second current sinks in dependence on an input signal and on the at least one feedback signal. Thus, the input circuit may be operative in dependence on first and second input signals and first and second feedback signals. The first embodiment may therefore function as a switched class (Class D) driver.

Alternatively or in addition, the load of the transformer driver circuit may comprise a filter circuit, such as an LC filter.

In a second embodiment, the transformer driver circuit may comprise a feedback circuit and the input circuit may be operative to provide first and second analogue control signals to the first and second current sinks in dependence on first and second input signals and the at least one feedback signal. Thus, the input circuit may be operative in dependence on first and second input signals and first and second feedback signals. The second embodiment may therefore function as a Class AB driver.

In a third embodiment, the input circuit may be configured to control the first and second current sinks in dependence on first and second digital input signals. Thus, the third embodiment may be of a direct drive configuration.

More specifically, the transformer driver circuit may comprise a feedback circuit and the input circuit may be operative to control the first and second current sinks in dependence on first and second digital input signals and at least one feedback signal. Thus, the input circuit may be operative in dependence on first and second digital input signals and first and second feedback signals.

Alternatively, the input circuit may be configured to control the first and second current sinks solely in dependence upon first and second digital input signals. Hence there may be no feedback from the transformer.

Alternatively or in addition, the input circuit and a current sink may comprise a digitally controlled current sink. More specifically, the digitally controlled current sink may be a current mode Digital to Analogue Converter (DAC).

In embodiments of the present invention other than the first embodiment it may be useful to adjust the injected power, e.g. to take account of a change in impedance at the output from the secondary winding and to thereby prevent saturation effects in the transformer driver circuit. Therefore, the transformer driver circuit may be configured to adjust a gain of an input circuit that is operative to provide control signals to the first and second current sinks in dependence on at least one of: determination of an impedance at an output from the secondary winding; and a quality of a signal at an output from the secondary winding.

More specifically, the transformer driver circuit may be operative: such that each of the first and second current sinks a predetermined current; to measure a magnitude of a voltage at the load; and to thereby adjust a gain of an input circuit that is operative to provide control signals to the first and second current sinks. In use, the gain of the input circuit may be adjusted to inject a desired or required amount of power. The present approach may be used upon transformer driver circuit start-up or periodically during operation of the transformer driver circuit.

Alternatively or in addition, the transformer driver circuit may be operative to: determine a voltage across the load; and to adjust a gain of an input circuit that is operative to provide control signals to the first and second current sinks in dependence on the determined voltage. More specifically, the voltage across the load may be determined over a period of time, e.g. during a frame where the transformer driver circuit forms part of data communications apparatus. In use, the impedance may be estimated from the determined voltage because the current flowing through the load is known, with the determined voltage or power being used to control the gain of the input circuit to change the current and thereby inject a desired or required amount of power. The present approach may be used during operation of the transformer driver circuit, i.e. on-the-fly. Further features and advantages of the present approach are described in WO 2008/013857 (to the present applicant).

Alternatively or in addition, the signal at the output from the secondary winding may be measured and the measurement analysed to determine the quality of the signal. More specifically, the determined quality may be compared with a predetermined (e.g. desired) quality level and the gain of an input circuit adjusted in dependence on the comparison. A quality measure may, for example, be the signal to noise ratio. Therefore, the transformer driver circuit may further comprise an analysis circuit, such as a Digital Signal Processor (DSP), that is operative to perform a quality analysis, e.g. by way of a Fast Fourier Transform (FFT) analysis, on the measured signal.

The capability to increase the injected power to a level above that which may be achieved by relying on an integrated circuit power supply may be beneficial in certain circumstances. For example, there may be a requirement to transmit signals on a communications channel of indeterminate length, such as on communications channels in a multi-media network in the home, where one or more of mains power wiring, co-axial cable and phone line may be used.

Therefore, according to a second aspect of the present invention, there is provided a transformer driver circuit comprising:
  a transformer comprising a primary winding and a secondary winding, the primary winding being electrically connected at a first end to a first unipolar controllable current sink and at a second end to a second unipolar controllable current sink;
  the primary winding comprising a transformer tap electrically connected to a first voltage source, the circuit being operable such that said first current sink selectively sinks current from said first end of the primary winding and said second current sink selectively sinks current from said second end of the primary winding thereby causing current to flow in the secondary winding in a push-pull fashion;
  control circuitry operable to provide analogue control signals to the first and second current sinks so as to cause them to sink current in a substantially linear dependence on at least the signal amplitude of said analogue control signals; and
  a load electrically connected to the secondary winding.

In a third aspect of the invention there is provided networking apparatus comprising the transformer driver circuit according to the first and second aspects of the present invention.

More specifically, the networking apparatus may be multi-media networking apparatus, e.g. installed or for installation in a residential or commercial building.

Further embodiments of the second and third aspects of the present invention may comprise one or more features of the first aspect of the present invention.

Other features of the invention are as described in the dependent claims.

BRIEF DESCRIPTION OF DRAWINGS

Further features and advantages of the present invention will become apparent from the following specific description, which is given by way of example only and with reference to the accompanying drawings, in which.

A bipolar output stage can generate more power than a unipolar output stage for the same supply voltage. However, a unipolar output stage can be adapted to higher output voltages more easily than a bipolar output stage. Therefore, to achieve high output power, it is proposed to combine these ideas by using two unipolar sources to provide a bi-polar output signal. The unipolar sources are unipolar current sources, and may be made using a variety of implementations, including approaches such as Class-D outputs, or multi-level current-drive circuits such as transconductor amplifiers or digital-to-analog converters.

Figure 2A:
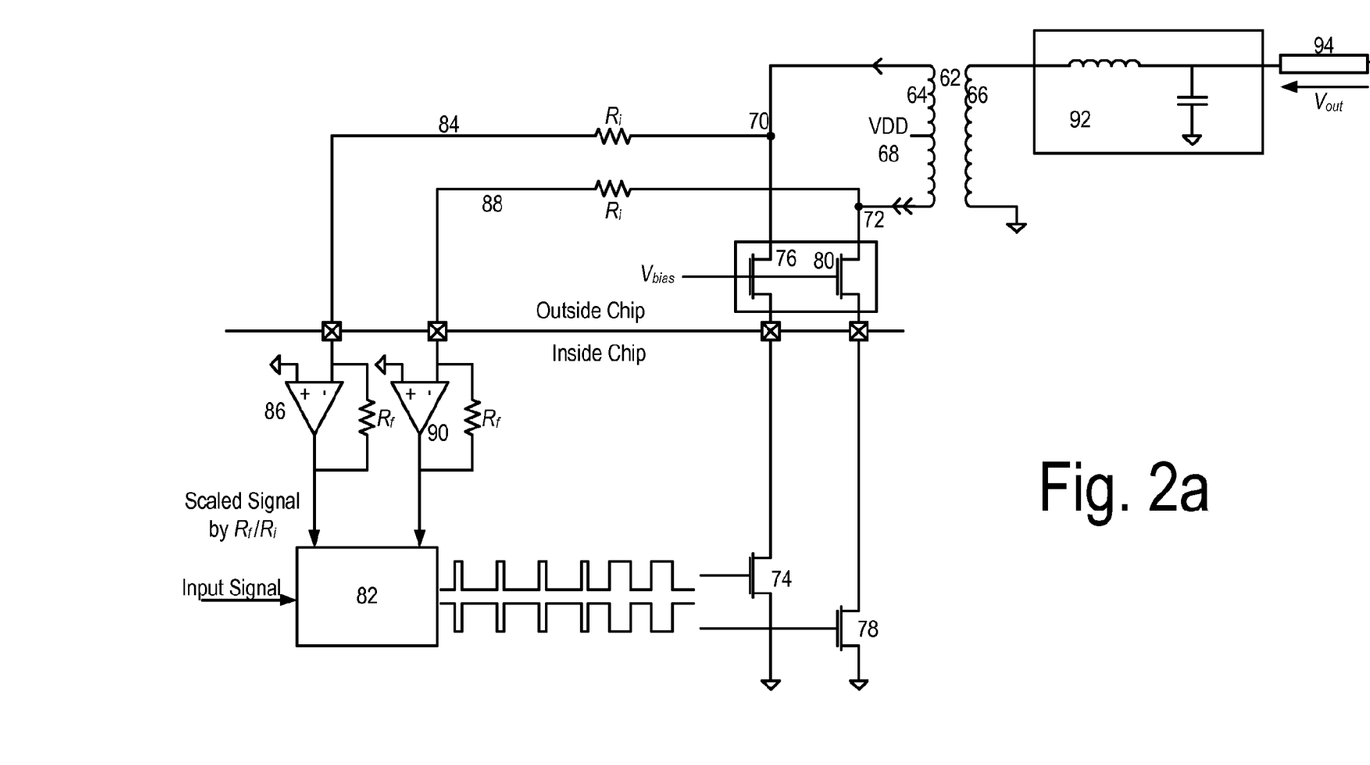
FIG. 2A is a first embodiment of the present invention.

FIG. 2A shows a first embodiment of the present invention, using a switched class (Class D) transformer driver circuit 60. The transformer driver circuit 60 comprises a transformer 62 comprising a primary winding 64 and a secondary winding 66. The primary winding 64 comprises a centre tap 68 (which constitutes a transformer tap) and first 70 and second 72 ends. The first end 70 of the primary winding is electrically connected to a first current source 74 by way of a first series connected protection circuit 76. The second end 72 of the primary winding is electrically connected to a second current source 78 by way of a second series connected protection circuit 80. The centre tap 68 is connected to a high voltage supply, which in a first form is an integrated circuit high voltage supply and in a second form is of a higher voltage level than the integrated circuit high voltage supply. Each of the first and second current sources 74, 78 is constituted as a MOS transistor, which is driven by an output signal from a modulator circuit 82. Each of the first and second protection circuits 76, 80 is constituted as a MOS transistor with its gate voltage maintained at a bias voltage determined such that a voltage across the associated current source does not exceed a safe operative limit. A first feedback path 84 conveys a first feedback signal from the first end 70 of the primary winding to the modulator circuit 82 by way of a first operational amplifier attenuator 86. An input resistance and a feedback resistance of the first operational amplifier attenuator 86 are selected to reduce the voltage swing of the first feedback signal to an acceptable level for the modulator circuit. A second feedback path 88 conveys a second feedback signal from the second end 72 of the primary winding to the modulator circuit 82 by way of a second operational amplifier attenuator 90. An input resistance and a feedback resistance of the second operational amplifier attenuator 90 are selected to reduce the voltage swing of the second feedback signal to an acceptable level for the modulator circuit. An LC filter 92 is provided at an output of the secondary winding 66 with a load 94 (e.g. the communications medium 140 described below with reference to FIG. 6) being present at the output of the LC filter. The first and second current sources 74, 78, the modulator circuit 82 and the first and second operational amplifier attenuators 86, 90 with the exception of the input resistors form part of a low voltage CMOS integrated circuit. The remaining components of the circuit of FIG. 2A are external to the integrated circuit.

In use, the modulator circuit 82 alternately operates the first 74 and second 78 current sources by means of digital control signals. When the first current source 76 is operated, the first end 70 of the primary winding is electrically connected to the low voltage supply. Hence, a current flows from the centre tap 68 to the first end 70 of the primary winding in a first direction, which is indicated by the single arrow in FIG. 2A. When the second current source 78 is operated, the second end 72 of the primary winding is electrically connected to the low voltage supply. Hence, a current flows from the centre tap 68 to the second end 72 of the primary winding in a second direction opposite the first direction; the second direction is indicated by the double arrow in FIG. 2A. It should be appreciated that energy can be transferred to and fro between the primary winding 64 and the secondary winding 66, and therefore between the load and power supply, the actual direction of transfer at any one time depending on factors such as the voltage/current flows at that particular time and the load characteristics (an inductive load is required for energy to flow back to the supply).

With a centre-tap voltage higher than the on-chip voltage, the circuit of FIG. 2A is capable of injecting a higher level of power than the circuit of FIG. 1A before encountering a roll-off in efficiency. The feedback circuitry provides for a reduction in the output signals from the modulator circuit 82 to thereby compensate for signals in the transformer-current source circuitry that are liable to cause saturation and to thereby cause distortion. Such saturation causing signals are liable to arise where the load is unknown or the load varies where the circuit of FIG. 2A is used in certain applications, such as in multi-media networking in residential or commercial premises as is described below with reference to FIG. 6.

Figure 2B:
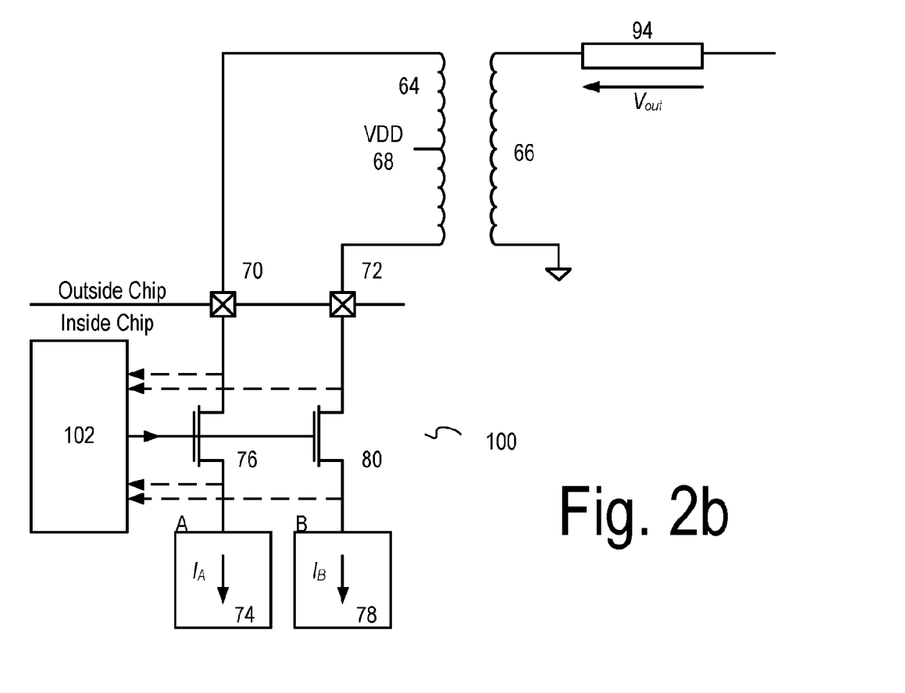
FIG. 2B is an alternative form of protection circuit for the first embodiment.

FIG. 2B shows an alternative form of protection circuit 100, which is used when the protection circuits form part of the integrated circuit. Components in common with the circuit of FIG. 2A are indicated by like reference numerals. The protection circuit 100 of FIG. 2B comprises the first and second MOS transistors 76, 80 and an adaptive biasing circuit 102. The adaptive biasing circuit is operative to vary the gate voltage of each of the first and second MOS transistors 76, 80 in dependence on the voltages at the sources and drains of the first and second MOS transistors 76, 80. Thus, the adaptive biasing circuit is operative to keep the voltage across each of the current sources 74, 78 and the first and second MOS transistors 76, 80 within tolerable limits. The design of an adaptive biasing circuit 102 will be within the ordinary design skills of the person skilled in the art.

Figure 3:
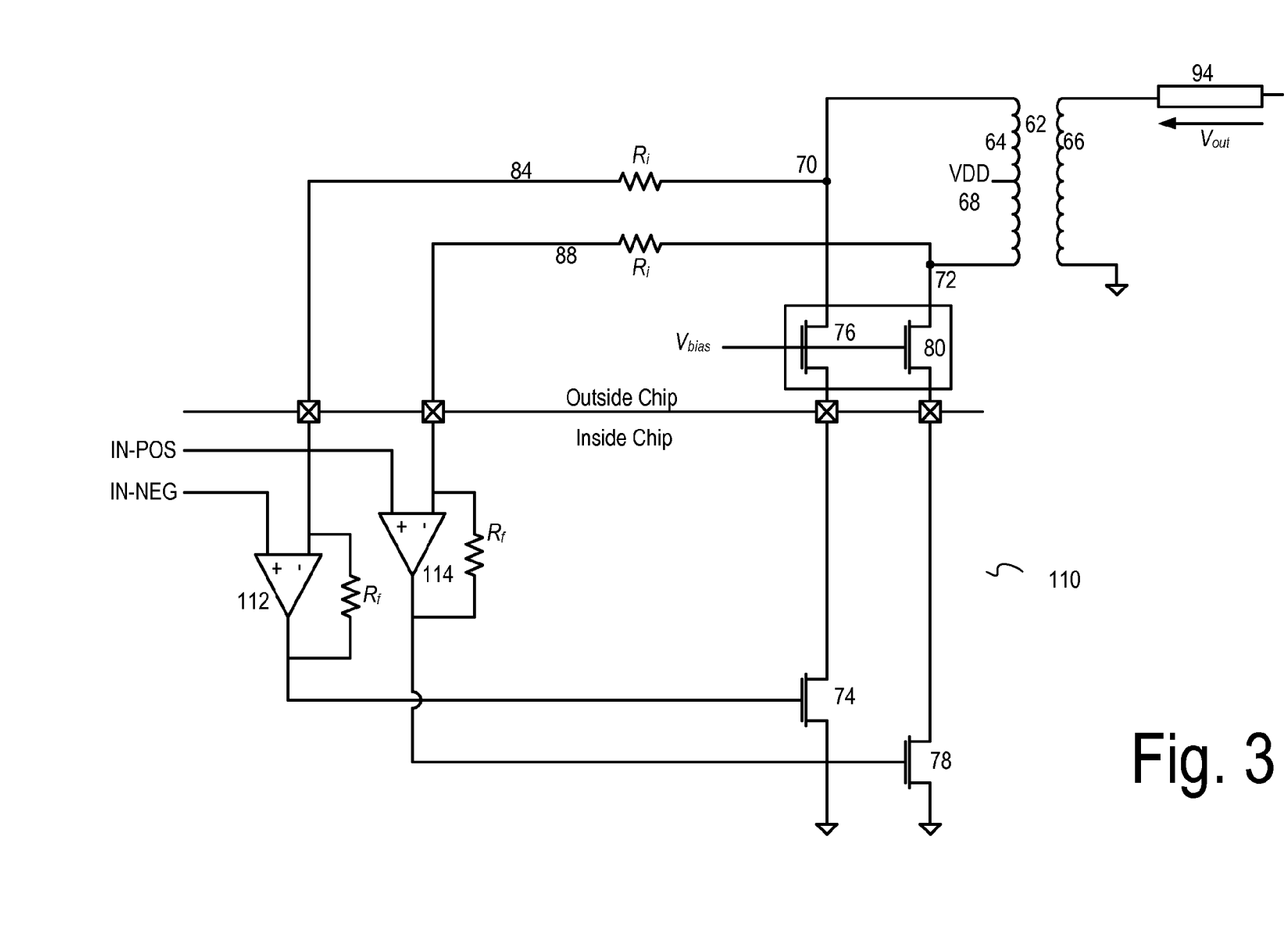
FIG. 3 is a second embodiment of the present invention.

A second embodiment of the present invention is shown in FIG. 3, namely a Class AB transformer driver circuit 110. Components in common with the circuit of FIG. 2A are indicated by like reference numerals and therefore the reader's attention is directed to the description for FIG. 2A with respect to such common components. The circuit of FIG. 3 operates in the same push-pull fashion as the circuit of FIG. 2A with the exception that the first and second current sources 74, 78 are operated by analogue drive signals so that the circuit operates in a linear fashion. Instead of the modulator circuit of the circuit of FIG. 2A, each of the two drive signals are received at respective non-inverting inputs of first 112 and second 114 operational amplifiers. The first 84 and second 88 feedback signals are received at respective inverting inputs of the first 112 and second 114 operational amplifiers. Each of the first 112 and second 114 operational amplifiers is configured as an attenuator with an input resistance and a feedback resistance selected to reduce the voltage swing of the feedback signal to an acceptable level for the integrated circuit. The outputs of the first 112 and second 114 operational amplifiers provide the drive signals for the first and second current sources 74, 78. Each operational amplifier adjusts its output voltage so that the inverting and non-inverting inputs are substantially equal. Hence, each operational amplifier adjusts the current sunk by the current source until the output at the load matches the input to the circuit.

Figure 4:
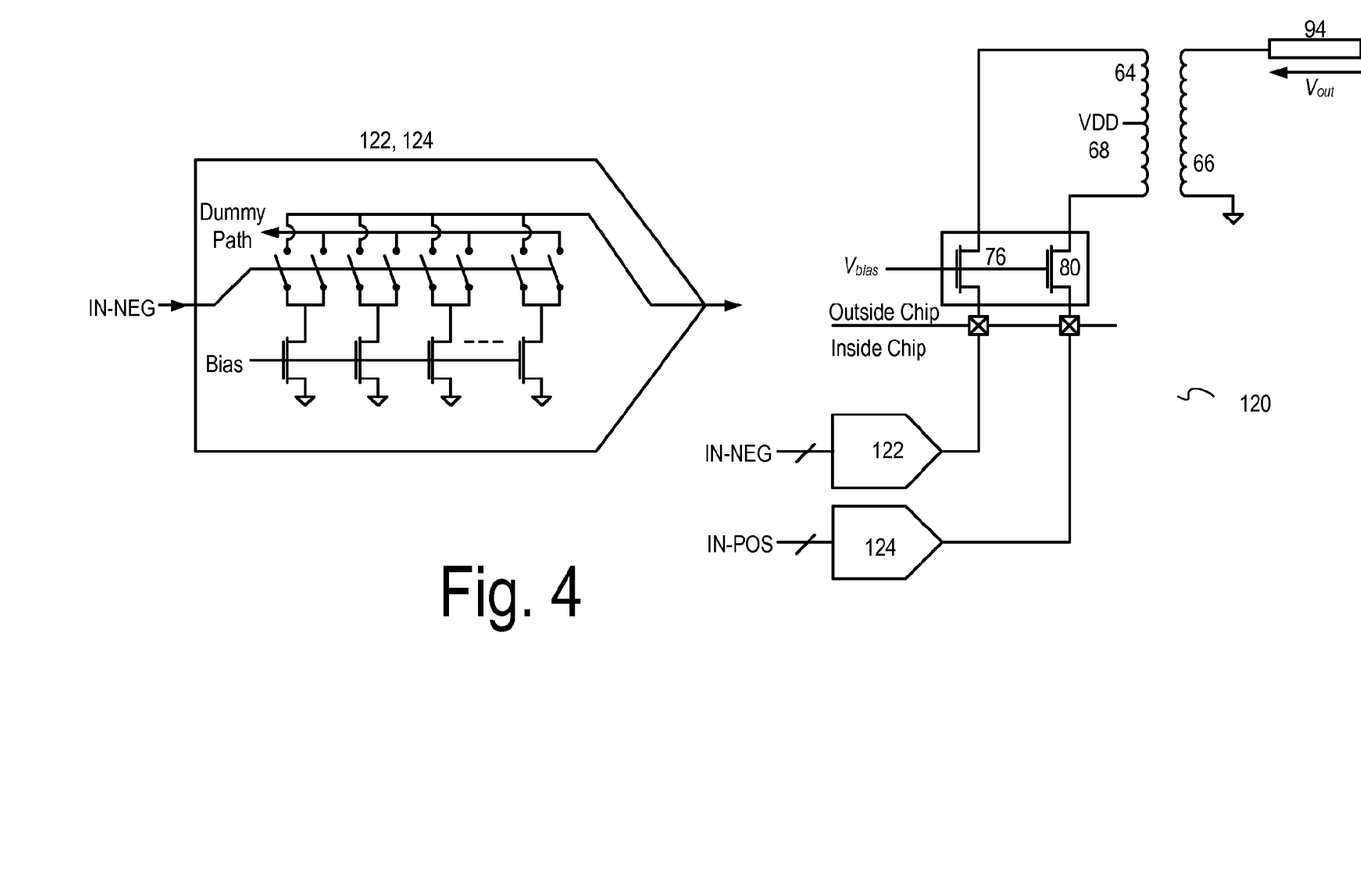
FIG. 4 is a third embodiment of the present invention.

A third embodiment of the present invention is shown in FIG. 4, namely a direct drive transformer driver circuit 120. Components in common with the circuit of FIG. 2A are indicated by like reference numerals and therefore the reader's attention is directed to the description for FIG. 2A with respect to such common components. The circuit of FIG. 3 comprises first 122 and second 124 current mode Digital to Analogue Converters (DACs) instead of the current sources shown in FIGS. 2A and 4. Each of the first 122 and second 124 current mode Digital to Analogue Converters provide for digitally controlled current sinking from its respective end of the primary winding 64. Each DAC 122, 124 may comprise the structure shown on the left of the Figure. A digital code input to each DAC provides for variation in the level of current sunk by the DAC. Hence, the circuit of FIG. 4 operates in the same push-pull fashion as the circuit of FIG. 2A. As can be seen, the circuit of FIG. 4 lacks the feedback circuitry of the circuits of FIGS. 2A and 4, although the circuit could be modified to provide for feedback. Such modification would be within the scope of the ordinary design skills of the person skilled in the art.

Figure 5:
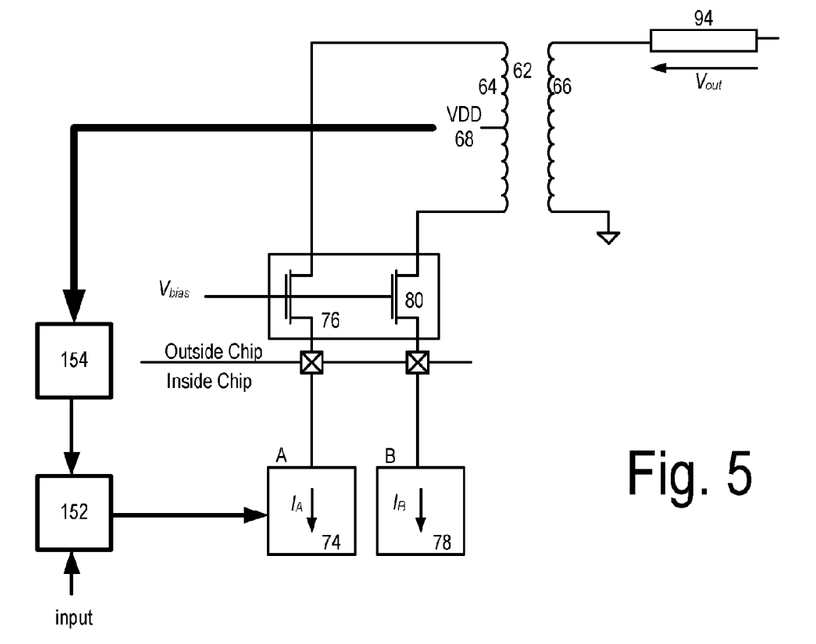
FIG. 5 is an embodiment of the present invention configured to determine an impedance at the output from the secondary winding.

FIG. 5 shows a non-switching transformer driver circuit 150, i.e. the embodiment of FIG. 3 or 4, which is configured to determine the impedance at the output from the secondary winding. Components in common with the circuit of FIG. 2A are indicated by like reference numerals and therefore the reader's attention is directed to the description for FIG. 2A with respect to such common components. The circuit of FIG. 5 comprises a gain control circuit 152 and an impedance monitoring circuit 154. In use, the transformer driver circuit is operative to source a known current by means of each of the first and second current sources and the impedance monitoring circuit 152 is operative to determine a voltage applied to the load 94 and to estimate an impedance of the load in dependence on the determined voltage and the current sourced by the first and second current sources, which are known. The impedance monitoring circuit 152 is then operative to change a gain of the gain control circuit 152 to thereby change the current sourced by the first and second current sources 74, 78 so that a desired or required amount of power is injected by the transformer driver circuit 150. Adjusting the current sourced by the first and second current sources 74, 78 in this fashion can prevent the transformer driver circuit from saturating and thereby causing distortion.

In another embodiment, which has the same components and configuration as the circuit shown in FIG. 5, the impedance monitoring circuit 154 is operative to measure a voltage signal across the load over a period of time, such as during a data frame, during ordinary use of the transformer driver circuit. The impedance monitoring circuit 154 is then operative to estimate an impedance of the load in dependence on the measured voltage and the current at the output from the secondary winding, which is known. The impedance monitoring circuit 152 is then operative to change a gain of the gain control circuit 152 to thereby change the current sourced by the first and second current sources 74, 78 so that a desired or required amount of power is injected by the transformer driver circuit 150. Adjusting the current sourced by the first and second current sources 74, 78 in this fashion can prevent the transformer driver circuit from saturating and thereby causing distortion. This approach is described in more detail in WO 2008/013857 (to the present applicant).

In an un-illustrated embodiment the gain of the gain control circuit 152 of FIG. 5 is adjusted in dependence on a quality measure made at the output from the secondary winding. More specifically, a signal at the output from the secondary winding is measured and analysed by means of a Digital Signal Processor (DSP), which is operative to perform a Fast Fourier Transform (FFT) on the measured signal to determine a signal to noise ratio of the measured signal. If the determined signal to noise ratio is not at a desired or required level, the gain of the gain control circuit 152 is adjusted to change the current sourced by the first and second current sources 74, 76 to meet the desired or required level of signal to noise ratio.

Figure 6:
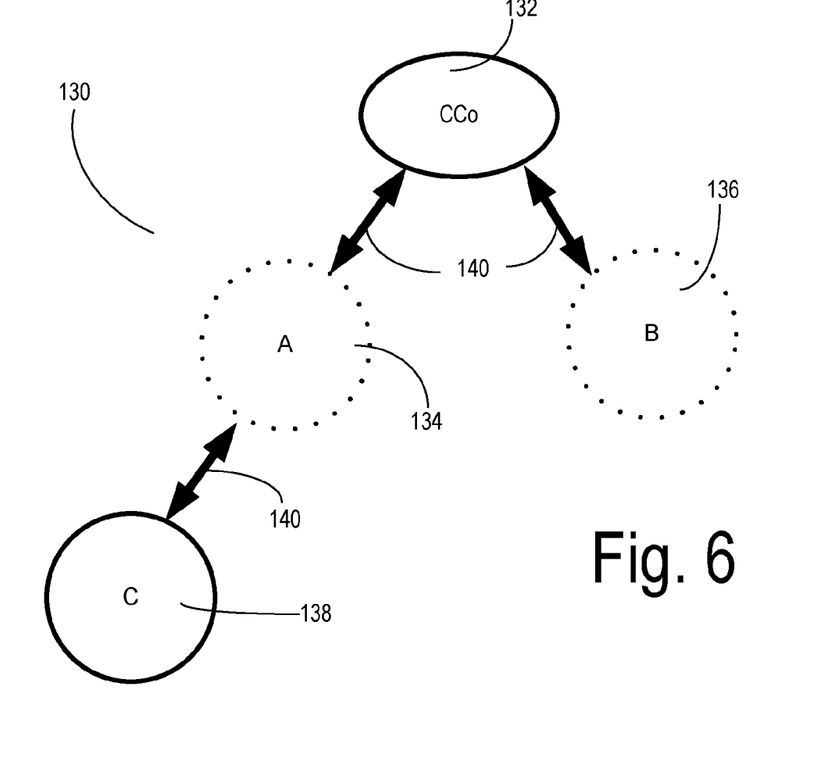
FIG. 6 is a representation of a network of consumer products in a building.

FIG. 6 shows a network 130 of consumer products in a building. The network comprises first 132, second 134, third 136 and fourth 138 nodes. Adjacent pairs of nodes are connected to each other by an already installed communications medium 140, such as mains power wiring, which provides for communication between and amongst a plurality of rooms in the residential building. Thus, for example, each of the first to fourth nodes may be located in a different room of the residential building. Each of the first to third nodes comprises a different multi-media device (which constitutes a consumer product). Thus, for example, the first node 132 comprises a Home Gateway (HGW), the second node 134 comprises Personal Computer (PC), the third node 136 comprises audio-visual entertainment apparatus and the fourth node 138 comprises network attached storage. In the network 130 of FIG. 6 the first node 132 is configured to operate as a communications controller, the second 134 and third 136 nodes are configured to operate as repeater nodes and the fourth node 138 is configured to operate as a standard network node. A communications controller controls the function of the network to which it belongs. Normally there is only one communications controller in a network. A standard node provides for communication of data from the branch of the communications medium leading to the node to the branch of communications medium leading from the node and for communication with the multi-media device connected to the node. A repeater node provides for communication of data from the branch of the communications medium leading to the node to the branch of communications medium leading from the node but provides for no communication with the multi-media device connected to the node, e.g. where the multi-media device is not being used. Referring to FIG. 6, the configuration of the nodes might be such that the HGW connected to the first node is streaming a film from an external source to the network and the NAS connected to the fourth node 138 might be saving the film. Network node apparatus is present at each of the first to fourth nodes 132, 134, 136, 138 of FIG. 6.

The network node apparatus of FIG. 6 comprises a home networking integrated circuit (a GGL541 from Gigle Networks Ltd of Capital House, 2 Festival Square, Edinburgh, EH3 9SU, UK) provided within an appropriate enclosure. Network node apparatus is operative to provide for communication with a consumer product by way of an Ethernet communications controller and with the other nodes in the network over at least one of mains power wiring, co-axial cable and phone line. Reference should be made to publicly available product data from the vendor of the GGL541; such product data provides sufficient information for the skilled person to implement the network shown in FIG. 6 without resorting to any more than ordinary design skill. A transformer driver circuit according to the present invention forms part of the home networking integrated circuit. More specifically, the transformer driver circuit is operative to drive the communications channel to the other nodes within the network. As described above, the transformer driver circuit of the present invention affords for increased power injection into the load be it in the form of mains power wiring, co-axial cable or phone line depending on the medium used for communication between and amongst nodes. The network of FIG. 6 may have communications channels of undetermined length and hence undetermined load resistance. Hence, it is advantageous to have the capability to regulate the transformer driver circuit to prevent its saturation as described above.

The invention claimed is:

1. A transformer driver circuit comprising:
an off-chip transformer comprising a primary winding and a secondary winding, the primary winding being electrically connected at a first end to a first unipolar controllable current sink and at a second end to a second unipolar controllable current sink, the first and second current sinks comprising part of an integrated circuit and having respective outputs at a boundary of the integrated circuit, the secondary winding providing a driven output;
the primary winding comprising a transformer tap electrically connected to a first voltage source, the transformer driver circuit configured such that the first current sink selectively sinks current from the first end of the primary winding and the second current sink selectively sinks current from the second end of the primary winding so as to cause current to flow in the secondary winding in a push-pull fashion;
an off-chip load electrically connected to the secondary winding;
modulator circuitry formed on the integrated circuit and configured to drive the first and second current sinks based upon an input signal and limited by first and second feedback signals;
protection circuitry formed on the integrated circuit and configured to provide the first and second feedback signals to limit operations of the first unipolar controllable current sink and the second unipolar controllable current sink to protect the integrated circuit from voltage levels greater than a protection voltage of the integrated circuit at the respective outputs.

2. The transformer driver circuit of claim 1, wherein the transformer tap comprises a center tap.

3. The transformer driver circuit of claim 2, wherein the transformer tap is electrically connected to a voltage of between two to five times greater than a supply voltage of the integrated circuit.

4. The transformer driver circuit of claim 1, wherein the transformer is in a high sided configuration with respect to the first and second current sinks.

5. The transformer driver of claim 1, wherein the primary winding comprises two series connected primary windings with the transformer tap being defined by a connection between the two primary windings.

6. The transformer driver circuit of claim 1, wherein at least one of the first and second current sinks is an active circuit.

7. The transformer driver circuit of claim 1, wherein the first voltage source differs from a voltage supply of the integrated circuit.

8. The transformer driver circuit of claim 1, wherein the protection circuitry comprises a first main protection circuit and a second main protection circuit, the first main protection circuit being in series between the first end of the primary winding and the first current sink, and the second main protection circuit being in series between the second end of the primary winding and the second current sink.

9. The transformer driver circuit of claim 8, wherein each main protection circuit comprises a protective transistor located off-chip.

10. The transformer driver circuit of claim 9, wherein the protection circuitry comprises adaptive biasing that is operative to adaptively bias a control electrode of each protective transistor.

11. The transformer driver circuit of claim 10, wherein the adaptive biasing comprises an on-chip biasing controller operable to receive an input signal from at least one of the main electrodes of each protective transistor and, in dependence on this input signal, to generate a biasing output that is received at a control electrode of each protective transistor.

12. The transformer driver circuit of claim 11, wherein a control electrode of each protective transistor is, in use, maintained substantially at a bias voltage.

13. The transformer driver circuit of claim 1, wherein the first current sink comprises a transistor in series with the first end of the primary winding, and the second current sink comprises a transistor in series with the second end of the primary winding.

14. The transformer driver circuit of claim 1, wherein only one of the first and second current sink sinks current at any time.

15. The transformer driver circuit of claim 1, further comprising control circuitry comprising part of the integrated circuit and configured to provide control signals to the first and second current sinks for control of the first and second current sinks in dependence on at least a main input signal.

16. The transformer driver circuit according to claim 15, wherein the control circuitry is operable to receive at least one feedback signal from the primary winding to provide feedback protection.

17. A transformer driver circuit comprising:
an off-chip transformer comprising a primary winding and a secondary winding, the primary winding being electrically connected at a first end to a first unipolar controllable current sink and at a second end to a second unipolar controllable current sink, both of the first unipolar controllable current sink and the second unipolar controllable current sink formed on an integrated circuit and having respective outputs at a boundary of the integrated circuit;
the primary winding comprising a transformer tap electrically connected to a first voltage source, the circuit being operable such that first current sink selectively sinks current from the first end of the primary winding and the second current sink selectively sinks current from the second end of the primary winding thereby causing current to flow in the secondary winding in a push-pull fashion;
control circuitry formed on the integrated circuit and configured to drive the first and second current sinks based upon an input signal and limited by first and second feedback signals;
protection circuitry formed on the integrated circuit and configured to provide the first and second feedback signals based upon feedback from the first end of the primary winding and the second end of the primary winding to limit operations of the first unipolar controllable current sink and the second unipolar controllable current sink to protect the integrated circuit from voltage levels greater than a protection voltage of the integrated circuit at the respective outputs; and
a load electrically connected to the secondary winding.

18. The transformer driver circuit of claim 17, wherein the first current sink comprises a transistor in series with the first end of the primary winding, and the second current sink comprises a transistor in series with the second end of the primary winding, each of the analog control signals being derived from a corresponding analog input signal and being received on its respective transistor's control electrode.

19. The transformer driver circuit of claim 17, wherein the control circuitry is operable to control the first and second current sinks in dependence on first and second digital input signals, the analog control signals being derived from the digital input signals.

20. The transformer driver circuit according to claim 17, further comprising at least one digital to analog converter to derive the analogue control signals from the digital input signals.

* * * * *